(12) United States Patent
Lin (10) Patent No.: US 9,941,138 B2
(45) Date of Patent: Apr. 10, 2018

(54) METHOD FOR EXPOSING POLYSILICON GATES (71) Applicant: SHANGHAI IC R&D CENTER CO., LTD., Shanghai (CN)

(72) Inventor: Hong Lin, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 15/336,785

(22) PCT Filed: Aug. 25, 2014

(86) PCT No.: PCT/CN2014/085100
§ 371 (c)(1),
(2) Date: Oct. 28, 2016

(87) PCT Pub. No.: WO2015/165178
PCT Pub. Date: Nov. 5, 2015

(65) Prior Publication Data
US 2017/0084466 A1 Mar. 23, 2017

(30) Foreign Application Priority Data

Apr. 28, 2014 (CN) .......................... 2014 1 0174482

(51) Int. Cl.
*H01L 21/311* (2006.01)
*H01L 21/28* (2006.01)
*H01L 21/3105* (2006.01)
*H01L 29/49* (2006.01)

(52) U.S. Cl.
CPC ........ *H01L 21/31116* (2013.01); *H01L 21/28* (2013.01); *H01L 21/31051* (2013.01); *H01L 21/31053* (2013.01); *H01L 29/4916* (2013.01)

(58) Field of Classification Search
CPC ............... H01L 21/31116; H01L 21/28; H01L 21/31051; H01L 29/4916
See application file for complete search history.

(56) References Cited

U.S. PATENT DOCUMENTS

| 6,010,931 A * | 1/2000 | Sun .................. H01L 27/10852 |
| | | 257/E21.648 |
| 6,180,501 B1 * | 1/2001 | Pey .................. H01L 21/28035 |
| | | 257/E21.165 |

FOREIGN PATENT DOCUMENTS

| CN | 102044437 A | 5/2011 |
| CN | 102737974 A | 10/2012 |
| CN | 10368144 A | 3/2014 |

* cited by examiner

*Primary Examiner* — Duy Vu N Deo
(74) *Attorney, Agent, or Firm* — Tianchen LLC (57) ABSTRACT

A method for exposing polysilicon gate electrodes is disclose. The method comprises planarizing a pre-metal dielectric on a wafer surface; performing a selective etching process to the planarized pre-metal dielectric and a multi-layer dielectric which covers polysilicon gates in the wafer according to pre-set etching parameters to expose the polysilicon gates in the wafer. The selective etching process effectively control the amount of etching, which ensures high surface flatness when exposing the polysilicon gates without affecting the subsequent film deposition process. Therefore, wafer surface defects, gate stack damages, and polysilicon gate deformation caused by the conventional CMP process or the shear stress generated during the CMP process can be avoided, and then product yield can be enhanced.

8 Claims, 5 Drawing Sheets

METHOD FOR EXPOSING POLYSILICON GATES

CROSS-REFERENCE TO RELATED APPLICATION

This application claims the priority benefit of International Patent Application Serial No. PCT/CN2014/085100, filed Aug. 25, 2014, which is related to and claims the priority benefit of China patent application serial No. 201410174482.2, filed Apr. 28, 2014. The entirety of each of the above-mentioned patent applications is hereby incorporated by reference herein and made a part of this specification.

FIELD OF THE INVENTION

The present invention generally relates to the field of semiconductor manufacturing, more particularly, to a method for exposing polysilicon gates.

BACKGROUND OF THE INVENTION

Poly-Si/SiO$_2$ is a typical gate stack choice of MOSFETs, and has been applied in ULSIC manufacturing for long time. According to Moore's Law, the size of the poly-Si/SiO$_2$ gate stack continuously reduces and the thickness of the gate oxide dielectric layer continuously decreases. However, in recent years, the thickness of the gate oxide dielectric layer begins to be subject to limitations of basic physical laws, challenging the thickness reduction prospect of the SiO$_2$ gate oxide dielectric layer. Accordingly, for the sub-32 nm technology node, the industry has focused on high-k/metal gate stack which has decreased equivalent oxide thickness of the gate dielectric layer, improved device performance with high reliability close to the conventional gate stack. The high-k/metal gate technology has a significant contribution to the progress of the process technology on the sub-32 nm CMOS technology node.

Two main approaches have emerged in the high-k/metal gate technology: gate-first and gate-last. In the gate-first process, the metal gate is formed first and followed by S/D ion implantation and high temperature anneal. In the gate-last process, the metal gate is formed after S/D implantation and high temperature anneal.

Currently, the introduction of the gate-last process enables semiconductor chips to have lower power consumption, less current leakage, and higher reliability under high-frequency operation. Therefore, the gate-last process is believed to be a sustainable solution that will satisfy the technical requirement for sub-32 nm generation transistors and new transistors like FinFETs.

The gate last process is also called a damascene-gate process, which includes the following steps: performing a FEOL process to form a semiconductor device including an NMOS transistor and a PMOS transistor each with a polysilicon gate, depositing a pre-metal dielectric layer, exposing the polysilicon gates by CMP and removing the polysilicon gates by etching; depositing a high-k material and two metal gate electrodes; and removing the metal on the surface of the pre-metal dielectric layer by CMP. Finally, an NMOS transistor and a PMOS transistor each with a high-k/metal gate stack are formed and isolated from each other. Since the metal gates are not subject to the S/D high temperature anneal and different metal materials are deposited for the NMOS and PMOS transistors respectively, the threshold voltage of each transistor can be effectively controlled.

During the step of exposing the polysilicon gates mentioned above, materials above the polysilicon gates are removed by CMP. However, the CMP process has the following defects.

On one hand, since the polysilicon gates are covered by multiple dielectric layers such as a SiO$_2$ dielectric layer, a Si$_3$N$_4$ high stress layer, and a doped pre-metal dielectric layer, the removal rate of SiO$_2$, Si$_3$N$_4$ and polysilicon is difficult to control during the CMP process, which may cause surface defects and affect product yield.

On the other hand, the shear stress generated during the CMP process may affect the gate stacks, or even affect the carrier mobility that has been enhanced by strain engineering technology. Furthermore, high shear stress generated in the CMP process may also cause deformation of the polysilicon gates, which increases difficulties in the subsequent cleaning and deposition process steps.

BRIEF SUMMARY OF THE DISCLOSURE

Accordingly, an objective of the present invention is to provide a method for exposing polysilicon gates in a gate-last process, which overcomes the problems of wafer surface defects, gate stack damages, polysilicon gate deformation caused by the conventional CMP process, so as to increase the product yield.

The method for exposing polysilicon gates according to the present invention includes the following steps: providing a wafer on which a multi-layer dielectric and a pre-metal dielectric are formed from bottom to top, wherein polysilicon gates are formed in the wafer and covered by the multi-layer dielectric. The method further comprises:

planarizing the pre-metal dielectric;

performing a selective etching process to the planarized pre-metal dielectric and the multi-layer dielectric on top surface of the polysilicon gates according to pre-set etching parameters to expose the polysilicon gates.

In an embodiment of the present invention, the pre-metal dielectric is plararized to have a predetermined thickness to provide a sufficient process window for the subsequent selective etching process.

In an embodiment of the present invention, the step of performing a selective etching to the planarized pre-metal dielectric and the multi-layer dielectric comprises: etching the plararized pre-metal dielectric and stopping at a dielectric layer adjacent to a bottom of the pre-metal dielectric according to the pre-set etching parameters.

In an embodiment of the present invention, the pre-metal dielectric is SiO$_2$ or doped SiO$_2$, the dielectric layer adjacent to the pre-metal dielectric is a Si$_3$N$_4$ high stress layer. During etching the plararized pre-metal dielectric, an etching selectivity ratio of SiO$_2$ to Si$_3$N$_4$ is greater than 25:1. Etching gas includes CF$_4$ at a flow rate of 3-7 sccm, C$_4$F$_8$ at a flow rate of 1-4 sccm, CO at a flow rate of 200-250 sccm, and Ar at a flow rate of 400-500 sccm. The plararized pre-metal dielectric is etched at a radio-frequency power of 2000-3000 W and at a gas pressure of 30-50 mTorr.

In an embodiment of the present invention, the step of performing a selective etching process to the planarized pre-metal dielectric and the multi-layer dielectric comprises: etching the plararized pre-metal dielectric and stopping at a top surface of the polysilicon gates according to the pre-set etching parameters.

In an embodiment of the present invention, the step of performing a selective etching process to the planarized pre-metal dielectric and the multi-layer dielectric comprises: etching downward from a dielectric layer adjacent to a bottom of the pre-metal dielectric and stopping at another dielectric layer adjacent to a top surface of the polysilicon gates according to the pre-set etching parameters.

In an embodiment of the present invention, the dielectric layer adjacent to the bottom of the multi-layer dielectric is a $Si_3N_4$ high stress layer, the another dielectric layer adjacent to the top surface of the polysilicon gates is a $SiO_2$ dielectric layer. During etching downward from the dielectric layer, an etching selectivity ratio of $Si_3N_4$ to $SiO_2$ is greater than 15:1. Etching gas includes $H_2$ at a flow rate of 5-9 sccm, $CH_3F$ at a flow rate of 4-8 sccm, $N_2$ at a flow rate of 80-130 sccm, and Ar at a flow rate of 400-500 sccm. The selective etching process is performed at a radio-frequency power of 800-1200 W and at a gas pressure of 60-80 mTorr.

In an embodiment of the present invention, the step of performing a selective etching process to the planarized pre-metal dielectric and the multi-layer dielectric comprises: etching downward from a dielectric layer adjacent to a bottom of the pre-metal dielectric and stopping at a top surface of the polysilicon gates.

In an embodiment of the present invention, the step of performing a selective etching process to the planarized pre-metal dielectric and the multi-layer dielectric comprises: etching a dielectric layer adjacent to the top surface of the polysilicon gates and stopping at a top surface of the polysilicon gates according to the pre-set etching parameters to expose the polysilicon gates.

In an embodiment of the present invention, the dielectric layer adjacent to the top surface of the polysilicon gates is a $SiO_2$ dielectric layer. During etching the dielectric layer adjacent to the top surface of the polysilicon gates, an etching selectivity ratio of $SiO_2$ to polysilicon is greater than 25:1. Etching gas includes $CF_4$ at a flow rate of 2-6 sccm, $C_4F_8$ at a flow rate of 2-5 sccm, CO at a flow rate of 220-300 sccm, and Ar at a flow rate of 400-500 sccm. The dielectric layer adjacent to the top surface of the polysilicon gates is etched at a radio-frequency power of 1500-2500 W and at a gas pressure of 35-55 mTorr.

Compared with the conventional method, a selective etching process based on pre-set etching parameters is performed to the planarized pre-metal dielectric and multiple dielectric layers on the top of the polysilicon gates to expose the polysilicon gates. Since the amount of etching is effectively controlled in selective etching process, high surface flatness can be ensured when the polysilicon gates are fully exposed, and subsequent film deposition process will not be affected. Therefore, wafer surface defects, gate stack damages, and polysilicon gate deformation caused by the conventional CMP process or the shear stress generated during the CMP process can be avoided, and then product yield can be enhanced.

DETAILED DESCRIPTION OF THE EMBODIMENTS

The present invention will now be descried more fully hereinafter with reference to the accompanying drawings. This invention may, however, be embodied in different forms and should not be construed as limited to the embodiments set forth herein. It will be understood by those skilled in the art that various changes in form and details may be made herein without departing from the spirit and scope of the invention.

According to the present invention, the method for exposing polysilicon gates comprises the following steps. Firstly, a wafer is provided. The wafer has a multi-layer dielectric and a pre-metal dielectric from bottom to top on its surface and polysilicon gates in it covered by the multi-layer dielectric. For example, the multi-layer dielectric has two dielectric layers stacked up and down. The upper dielectric layer is adjacent to the bottom of the pre-metal dielectric, the lower dielectric layer is adjacent to the polysilicon gates. In the following embodiments, a two-layer dielectric is taken as an example for illustration, but the present invention shall not be limited thereto. The pre-metal dielectric is planarized, and then a selective etching process is performed to the planarized pre-metal dielectric and the multi-layer dielectric on the top of the polysilicon gates according to pre-set etching parameters, so as to expose the polysilicon gates. Since the amount of etching is effectively controlled in the selective etching process, high surface flatness can be ensured when the polysilicon gates are fully exposed, and the subsequent film deposition process will not be affected. Therefore, wafer surface defects, gate stack damages, and polysilicon gate deformation caused by the conventional CMP process or the shear stress generated during the CMP process can be avoided, and then product yield can be enhanced.

According to the exposing method for polysilicon gates of the present invention, firstly a CMP process is performed to the pre-metal dielectric to planarize the pre-metal dielectric; then a selective etching process is performed to the planarized pre-metal dielectric and the multi-layer dielectric on the top of the polysilicon gates according to pre-set etching parameters, so as to expose the polysilicon gates.

Wherein, the pre-set etching parameters comprises etching gas composition and flow rate, radio-frequency power, and gas pressure that achieve a desired etching selectivity ratio.

Wherein, when performing the selective etching process to the planarized pre-metal dielectric and the multi-layer dielectric, the planarized pre-metal dielectric and each layer of the multi-layer dielectric can be etched successively. Alternatively, the selective etching process can be performed to only one or some layers of the multi-layer dielectric if a process window for selective etching the layer(s) is provided. The embodiments will be described in detail as follows.

Figure 1:
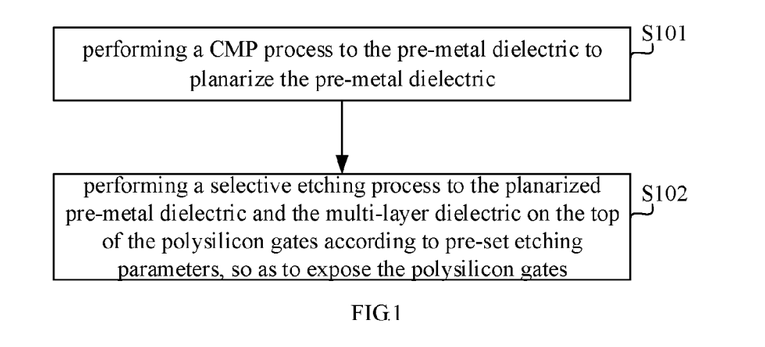
FIG. 1 is a flow chart illustrating the method for exposing polysilicon gates according to a first embodiment of the present invention.

FIG. 1 is a flow chart illustrating the method for exposing polysilicon gates according to a first embodiment of the present invention. The method comprises the following steps:

S101, performing a CMP process to the pre-metal dielectric to planarize the pre-metal dielectric.

Herein, the pre-metal dielectric (PMD) acts as an insulating layer between semiconductor devices and metal interconnects, and also acts as a protect layer preventing the semiconductor devices from impurity contamination. The pre-metal dielectric can be $SiO_2$ or doped $SiO_2$, such as $SiO_2$ doped with non-metal material like boron, phosphorus, fluorine, etc.

Figure 2:
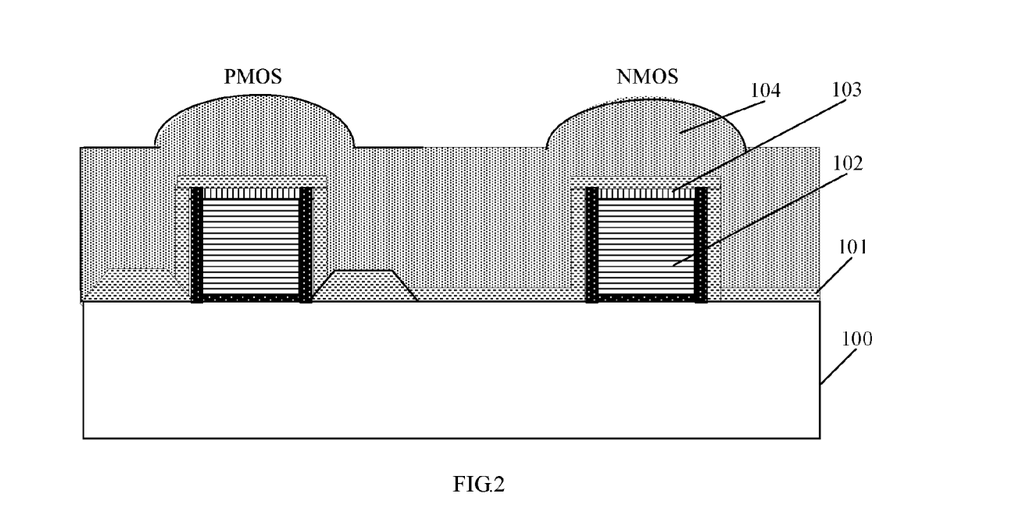
FIG. 2 is a cross-sectional view of a wafer before the step of pre-metal dielectric planarization according to the first embodiment of the present invention.

FIG. 2 is a cross-sectional view of a wafer before the step of pre-metal dielectric planarization according to the first embodiment of the present invention. As shown in FIG. 2, on the substrate 100, there are a $Si_3N_4$ high stress layer 101, polysilicon gates 102, sidewall spacers 105, a $SiO_2$ dielectric layer 103 and the pre-metal dielectric 104. Wherein, the surface of the pre-metal dielectric 104 is uneven.

Figure 3:
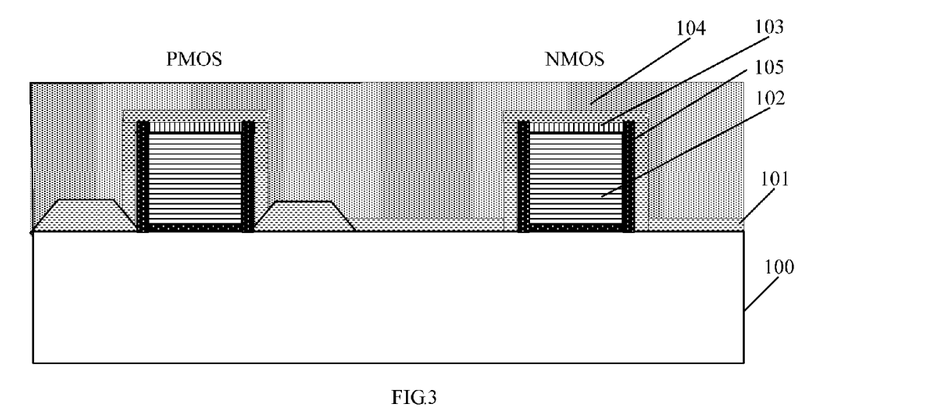
FIG. 3 is a cross-sectional view of a wafer after the step of pre-metal dielectric planarization according to the first embodiment of the present invention.

In the embodiment, in order to provide the process window for the subsequent selective etching process, when performing the CMP process, the pre-metal dielectric 104 is thinned to remain a predetermined thickness after planarization. For example, the planarized pre-metal dielectric has a thickness of 60-100 nm above the multi-layer dielectric after CMP, as shown in FIG. 3.

S102, performing a selective etching process to the planarized pre-metal dielectric and the multi-layer dielectric on the top of the polysilicon gates according to pre-set etching parameters, so as to expose the polysilicon gates.

In the embodiment, the multi-layer dielectric comprises, from bottom to top, the $SiO_2$ dielectric layer 103 and the $Si_3N_4$ high stress layer 101. It is noted that the multi-layer dielectric is not limited to these two layers, it can also have other layers.

It is known that there are two types of etching process: dry etching and wet etching. For different etching process, the etching parameters should be set correspondingly. Furthermore, for different etching equipment and different materials to be etched, the etching parameters should also be set correspondingly. Therefore, the etching parameters are determined in consideration of the specific etching process, the etching equipment, as well as the materials to be etched.

In the step S102 of the embodiment, the selective etching process is a dry etching process performed in an etching equipment manufactured by LAM Research corporation.

In the step S102, the planarized pre-metal dielectric 104 and each layer of the multi-dielectric above the top surface of the polysilicon gates 102 are etched successively.

Figure 4:
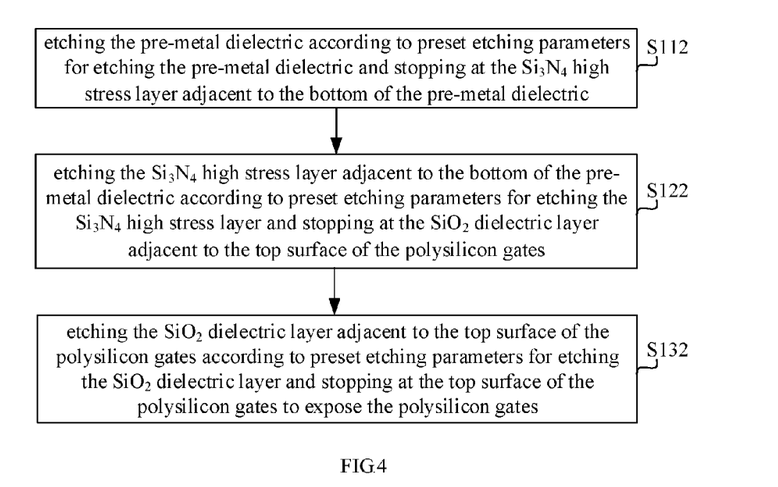
FIG. 4 is a flow chart illustrating the step S102 according to the first embodiment of the present invention.

As shown in FIG. 4, which is a specific flow chart illustrating the step S102, the step S102 comprises:

Step S112, etching the pre-metal dielectric 104 according to preset etching parameters for etching the pre-metal dielectric 104 and stopping at the $Si_3N_4$ high stress layer 101 adjacent to the bottom of the pre-metal dielectric 104.

Figure 5:
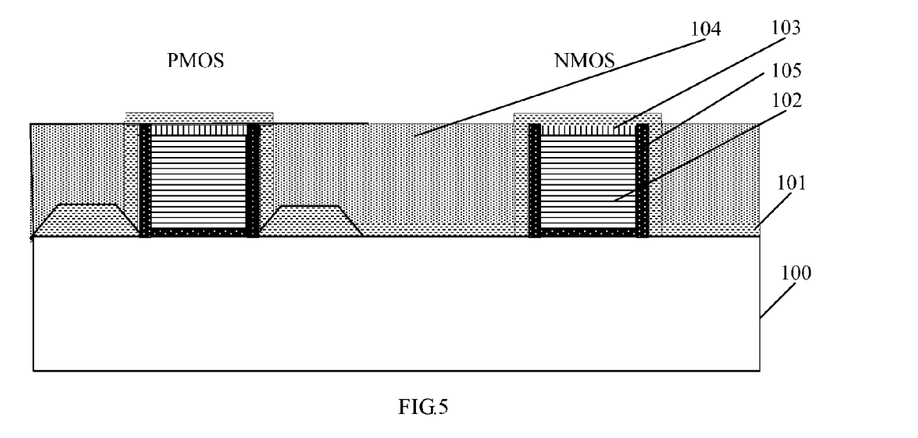
FIG. 5 is a cross-sectional view of a wafer after the step S112.

In the embodiment, a group of etching parameters for etching the pre-metal dielectric are preset. When etching the pre-metal dielectric 104, since the material of the pre-metal dielectric 104 is $SiO_2$ or doped $SiO_2$, an etching selectivity ratio of $SiO_2$ to $Si_3N_4$ is set to be greater than 25:1. Due to this high etching selectivity of the pre-metal dielectric 104, the $Si_3N_4$ high stress layer will barely be etched when etching the pre-metal dielectric 104. In order to achieve such high etching selectivity ratio, the etching parameters for etching the pre-metal dielectric are set as follows: etching gas composition and flow rate include $CF_4$ at a flow rate of 3-7 sccm, $C_4F8$ at a flow rate of 1-4 sccm, CO at a flow rate of 200-250 sccm, and Ar at a flow rate of 400-500 sccm; the radio-frequency power is between 2000-3000 W and the gas pressure is between 30-50 mTorr. FIG. 5 illustrates the wafer after the step S112.

Step S122, etching the $Si_3N_4$ high stress layer 101 adjacent to the bottom of the pre-metal dielectric 104 according to preset etching parameters for etching the $Si_3N_4$ high stress layer and stopping at the $SiO_2$ dielectric layer 103 adjacent to the top surface of the polysilicon gates 102.

Figure 6:
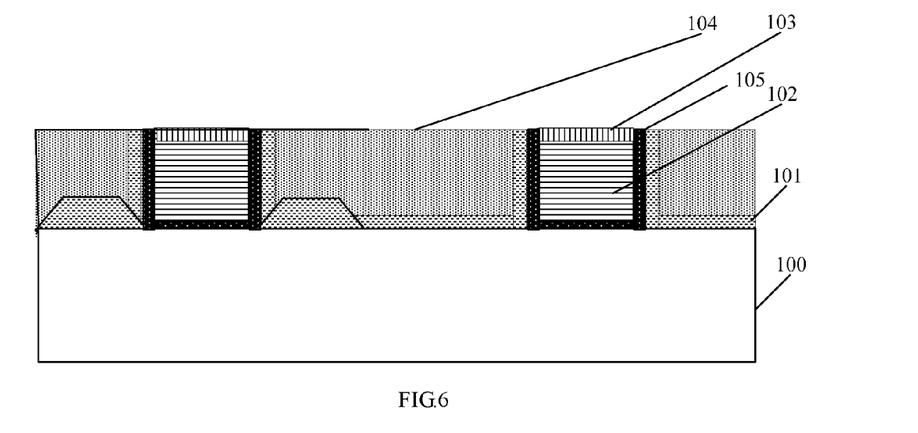
FIG. 6 is a cross-sectional view of a wafer after the step S122.

In the embodiment, another group of etching parameters for etching the $Si_3N_4$ high stress layer 101 are preset. When etching the $Si_3N_4$ high stress layer 101, since the remaining pre-metal dielectric 104 is exposed, an etching selectivity ratio of $Si_3N_4$ to $SiO_2$ should be high to prevent damage to the pre-metal dielectric 104. It is noted that, the material of the dielectric layer 103 is also $SiO_2$, thus the high etching selectivity ratio of $Si_3N_4$ to $SiO_2$ also protects the $SiO_2$ dielectric layer 103 from being etched. Accordingly, the selectivity ratio of $Si_3N_4$ to $SiO_2$ is set to be greater than 15:1. In order to achieve such high etching selectivity ratio, another group of etching parameters for etching the $Si_3N_4$ high stress layer are set as follows: etching gas composition and flow rate includes $H_2$ at a flow rate of 5-9 ccm, $CH_3F$ at a flow rate of 4-8 sccm, $N_2$ at a flow rate of 80-130 sccm, and Ar at a flow rate of 400-500 sccm; the radio-frequency power is set between 800-1200 W and the gas pressure is set between 60-80 mTorr. FIG. 6 illustrates the wafer after the etching step of S122.

It is noted that, in other embodiments of the present invention, the step S122 may comprise: etching downward from a dielectric layer adjacent to the bottom of the pre-metal dielectric and stopping at another dielectric layer adjacent to the top surface of the polysilicon gates according to the pre-set etching parameters. In other words, after etching the dielectric layer adjacent to the bottom of the pre-metal dielectric, continue etching other dielectric layers until the surface of the dielectric layer adjacent to the top surface of the polysilicon gates.

Step S132, etching the $SiO_2$ dielectric layer 103 adjacent to the top surface of the polysilicon gates 201 according to preset etching parameters for etching the $SiO_2$ dielectric layer 103 and stopping at the surface of the polysilicon gates 102 to expose the polysilicon gates 102.

Figure 7:
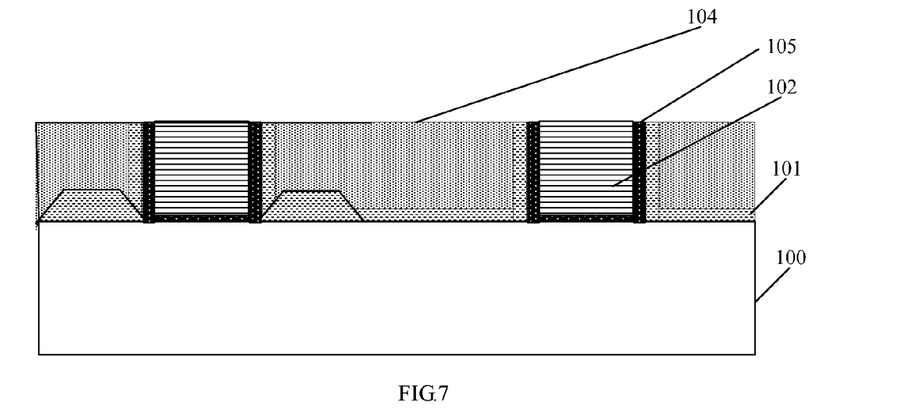
FIG. 7 is a cross-sectional view of a wafer after the step S132.

In the embodiment, another group of etching parameters for etching the $SiO_2$ dielectric layer are preset. When etching the $SiO_2$ dielectric layer 103, an etching selectivity ratio of $SiO_2$ to polysilicon should be high to prevent damage to the underlying polysilicon gates 102. FIG. 7 illustrates the wafer after the step S132. Herein, the etching selectivity ratio of $SiO_2$ to polysilicon is set to be greater than 25:1. In order to achieve such high etching selectivity ratio, the etching parameters for etching the $SiO_2$ dielectric layer are set as follows: etching gas composition and flow rate includes $CF_4$ at a flow rate of 2-6 sccm, $C_4F_8$ at a flow rate of 2-5 sccm, CO at a flow rate of 220-300 sccm, and Ar at a flow rate of 400-500 sccm; the radio-frequency power is between 1500-2500 W and the gas pressure is between 35-55 mTorr. Under the above conditions, although the etching selectivity ratio of $SiO_2$ to $Si_3N_4$ is also high, it will not affect the process effect. This is because that in the actual process, the $SiO_2$ dielectric layer 103 is extremely thin, even the remaining $Si_3N_4$ high stress layer outside the sidewall spacers of the polysilicon gates becomes higher than the top surface of the polysilicon gates 102 and the remaining pre-metal dielectric after the removal of the $SiO_2$ dielectric layer 103, such height difference can be omitted. Moreover, after exposing the polysilicon gates 102, subsequent processes like removing the polysilicon gates, filing metal gates will be performed. During these processes, planarization steps may also be performed to remove the raised portion of the $Si_3N_4$ high stress layer.

It is also noted that, the material of the sidewall spacers 105 of the polysilicon gates can be SiN, or composite of SiN and $SiO_2$. When etching the $SiO_2$ dielectric layer 103, the etching rate of the sidewall spacers 105 is equal or close to that of the $Si_3N_4$ high stress layer 101. As a result, the top of the sidewall spacers 105 may also be higher than the top of the polysilicon gates 102 and the remaining pre-metal dielectric. As mentioned above, during the actual process, the $SiO_2$ dielectric layer 103 is extremely thin, and such height difference can also be omitted. Furthermore, the height difference can be reduced or eliminated during the planarization steps in the subsequent processes. Therefore, the subsequent processes and the whole device performance will not be affected.

In the above disclosure, sccm is a flow unit, defined as standard-state cubic centimeter per minute. Torr is a gas pressure unit, defined as exactly 1/760 of a standard atmosphere, mTorr is 0.001 Torr.

During the above steps S112-S132, the etching selectivity can be optimized by regulation of etching gas and radio-frequency power, the etching amount can be accurately controlled by End Point Detection and etching time adjustment, such that can stop the etching at a desired dielectric layer.

It is noted that, in another embodiment of the present invention, if the wafer already has the structure as shown in FIG. 5 by other processes before the step S122, then the step S102 only comprises the step S122 and the step S132.

Similarly, in another embodiment of the present invention, if the wafer already has the structure as shown in FIG. 6 by other processes before the step S132, then the step S102 only comprises the step S132.

Figure 8:
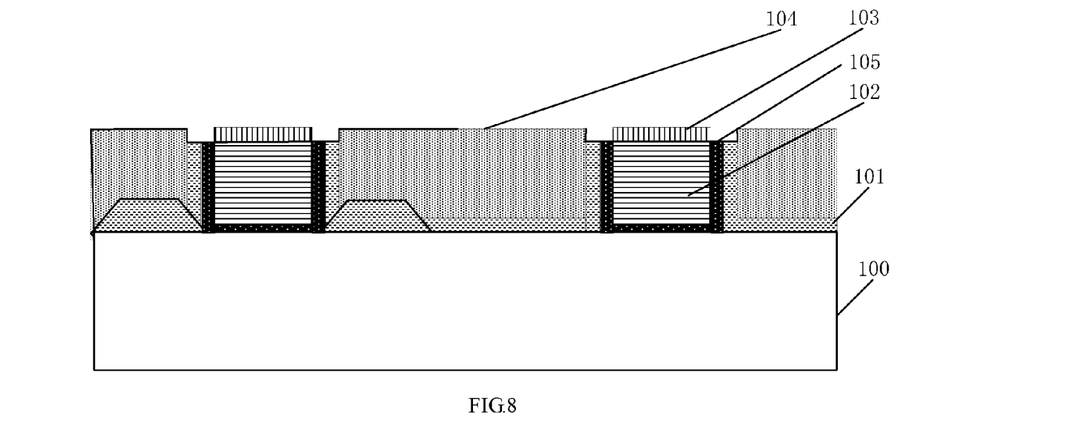
FIG. 8 is a cross-sectional view of a wafer after the step of over etching the dielectric layer adjacent to the bottom of the pre-metal dielectric according to a second embodiment of the present invention.

In a second embodiment of the present invention, the initial structure of the wafer is the same as that in the first embodiment. FIG. 8 shows the wafer after a step of over etching the dielectric layer adjacent to the bottom of the pre-metal dielectric. In the embodiment, the step S122" and the step S132" are different from the step S122 and the step S132 in the first embodiment. Specifically, the step S122" comprises: etching the $Si_3N_4$ high stress layer 101 above the $SiO_2$ dielectric layer 103, over etching the $Si_3N_4$ high stress layer 103 to substantially the top surface of the polysilicon gates. The step S132" comprises: etching the $SiO_2$ dielectric layer 103 to the top surface of the polysilicon gates 102. As a result, before etching the $SiO_2$ dielectric layer 103, the remaining $Si_3N_4$ high stress layer 101, the sidewall spacers 105, and the top of the polysilicon gates 102 are all in the same height, which benefits the subsequent etching process and the device performance. Specifically, in the subsequent etching process for the $SiO_2$ dielectric layer 103, the etching selectivity ratio of $SiO_2$ to polysilicon is critical. If the process parameters are adjusted to achieve simultaneous etching of the $SiO_2$ dielectric layer and the $Si_3N_4$ high stress layer, then the etching selectivity ratio of $SiO_2$ to polysilicon may not meet the requirement. Therefore, in the step S122", the $Si_3N_4$ high stress layer above the top of the polysilicon gates is over etched, leaving out of consideration of etching the $Si_3N_4$ during the subsequent etching process for the $SiO_2$ dielectric layer. Since only the selectivity ratio of $SiO_2$ to polysilicon needs to meet the requirement, the process difficulties are greatly reduced.

Figure 9:
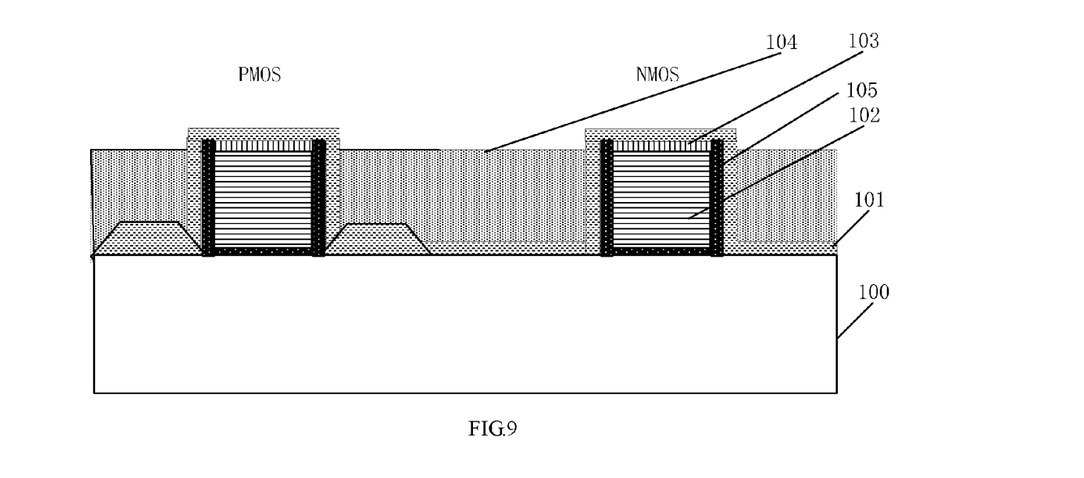
FIG. 9 is a cross-sectional view of a wafer after the step S112' according to a third embodiment of the present invention.
Figure 10:
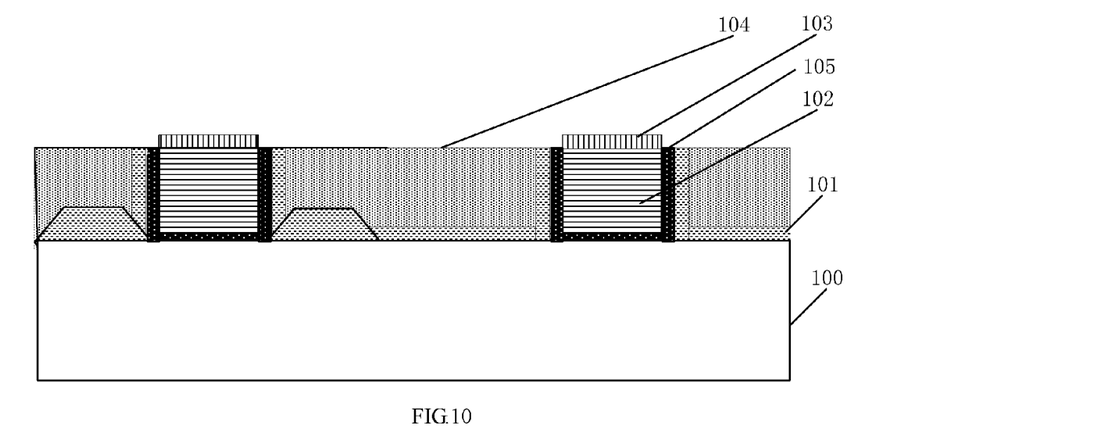
FIG. 10 is a cross-sectional view of a wafer after the step S122' according to the third embodiment of the present invention.
Figure 11:
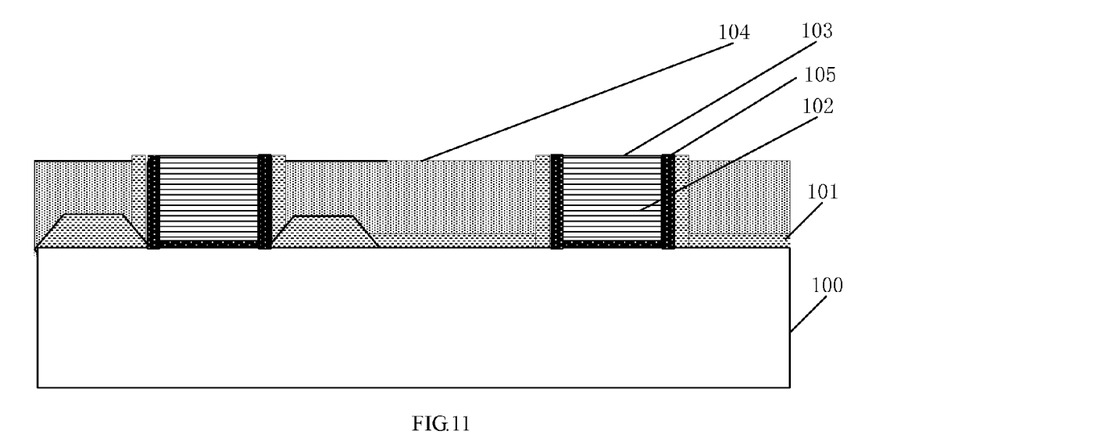
FIG. 11 is a cross-sectional view of a wafer after the step S132' according to the third embodiment of the present invention.

According to a third embodiment of the present invention, as shown in FIG. 9-FIG. 11, the step S102 is different from that in the first embodiment. In the embodiment, the step S102 comprises:

Step S112': etching the planarized pre-metal dielectric 104 and stopping at a top surface of the polysilicon gates 102.

FIG. 9 illustrates the structure of the wafer after the step S112'. The etching parameters are the same as those in the first embodiment, which is omitted herein.

In the step, by etching the pre-metal dielectric 104 to the top surface of the polysilicon gates 102, a wider process window for the following etching process for the $Si_3N_4$ high stress layer is provided, which reduces the difficulties to etch the $Si_3N_4$ high stress layer 101 to the top surface of the polysilicon gates 102.

Step S122': etching the $Si_3N_4$ high stress layer 101 adjacent to the bottom of the pre-metal dielectric 104 and stopping at the top surface of the polysilicon gates 102, that is, stopping at the top surface of the remaining pre-metal dielectric 104.

FIG. 10 illustrates the structure of the wafer after the step S122'. The etching parameters are the same as those in the first embodiment, which is omitted herein.

Since the sidewall spacers 105 and the $Si_3N_4$ high stress layer 101 have the same or similar material, the sidewall spacers and the $Si_3N_4$ high stress layer are simultaneously etched to the top surface of the polysilicon gates 102.

It is noted that, in other embodiments of the present invention, the step S122' may comprise: etching downward from a dielectric layer adjacent to the bottom of the pre-metal dielectric and stopping at the top surface of the polysilicon gates according to the pre-set etching parameters. In other words, after etching the dielectric layer adjacent to the bottom of the pre-metal dielectric, continue etching other dielectric layers until the top surface of the polysilicon gates.

Step S132', etching the $SiO_2$ dielectric layer 103 adjacent to the top surface of the polysilicon gates 201 and stopping at the top surface of the polysilicon gates 102 to expose the polysilicon gates 102.

Herein, since the pre-metal dielectric 104 and the $SiO_2$ dielectric layer 103 have the same or similar material, the pre-metal dielectric 104 may also be etched by a certain thickness to be lower than the polysilicon gates in the step S132'. However, by the subsequent film deposition process and planarization process, the height difference between the pre-metal dielectric 104 and the polysilicon gates 102 will be reduced or eliminated, without affecting the subsequent processes or the whole device performance.

FIG. 11 illustrates the structure of the wafer after the step S132'. The etching parameters are the same as those in the first embodiment, which is omitted herein.

During the above steps S112'-S132', the etching selectivity can be optimized by regulation of etching gas and radio-frequency power, the etching amount can be accurately controlled by End Point Detection and etching time adjustment, such that can stop the etching at a desired dielectric layer.

It is noted that, in another embodiment of the present invention, if the wafer already has the structure as shown in FIG. 9 by other processes before the step S122', then the step S102 only comprises the step S122' and the step S132'.

Similarly, in another embodiment of the present invention, if the wafer already has the structure as shown in FIG. 10 by other processes before the step S132', then the step S102 only comprises the step S132'.

In summary, according to the exposing method for the polysilicon gates of the present invention, selective etching is utilized to effectively control the amount of etching, so as to achieve high surface flatness when exposing the polysilicon gates without affecting the subsequent film deposition process. Therefore, wafer surface defects, gate stack damages, and polysilicon gate deformation caused by the conventional CMP process or the shear stress generated during the CMP process can be avoided, and then product yield can be enhanced.

While this invention has been particularly shown and described with references to preferred embodiments thereof, it will be understood by those skilled in the art that various changes in form and details may be made herein without departing from the spirit and scope of the invention as defined by the appended claims.

The invention claimed is:

1. A method for exposing polysilicon gate electrodes comprises:
providing a wafer on which a multi-layer dielectric and a pre-metal dielectric are formed from bottom to top, wherein polysilicon gates are formed in the wafer and covered by the multi-layer dielectric;
planarizing the pre-metal dielectric;
performing a selective etching process to the planarized pre-metal dielectric and the multi-layer dielectric according to pre-set etching parameters to expose the polysilicon gates; wherein,
the step of performing a selective etching process to the planarized pre-metal dielectric and the multi-layer dielectric further comprises: etching the plararized pre-metal dielectric and stopping at a dielectric layer adjacent to a bottom of the pre-metal dielectric according to the pre-set etching parameters; wherein the pre-metal dielectric is $SiO_2$ or doped $SiO_2$, the dielectric layer adjacent to the bottom of the pre-metal dielectric is a $Si_3N_4$ high stress layer; during etching the plararized pre-metal dielectric, an etching selectivity ratio of $SiO_2$ to $Si_3N_4$ is greater than 25:1; etching gas includes $CF_4$ at a flow rate of 3-7 sccm, $C_4F_8$ at a flow rate of 1-4 sccm, CO at a flow rate of 200-250 sccm, and Ar at a flow rate of 400-500 sccm; the plararized pre-metal dielectric is etched at a radio-frequency power of 2000-3000 W and at a gas pressure of 30-50 mTorr.

2. The method according to claim 1, wherein the pre-metal dielectric is plararized to have a predetermined thickness to provide a sufficient process window for the selective etching process.

3. The method according to claim 1, wherein the step of performing a selective etching process to the planarized pre-metal dielectric and the multi-layer dielectric further comprises:
etching the plararized pre-metal dielectric and stopping at a top surface of the polysilicon gates according to the pre-set etching parameters.

4. The method according to claim 1, wherein the step of performing a selective etching process to the planarized pre-metal dielectric and the multi-layer dielectric further comprises:
etching downward from the $Si_3N_4$ high stress layer and stopping at another dielectric layer adjacent to a top surface of the polysilicon gates according to the pre-set etching parameters.

5. The method according to claim 4, wherein the another dielectric layer adjacent to the top surface of the polysilicon gates is a $SiO_2$ dielectric layer; during etching downward from the $Si_3N_4$ high stress layer, an etching selectivity ratio of $Si_3N_4$ to $SiO_2$ is greater than 15:1; etching gas includes $H_2$ at a flow rate of 5-9 sccm, $CH_3F$ at a flow rate of 4-8 sccm, $N_2$ at a flow rate of 80-130 sccm, and Ar at a flow rate of 400-500 sccm; the selective etching process is performed at a radio-frequency power of 800-1200 W and at a gas pressure of 60-80 mTorr.

6. The method according to claim 1, wherein the step of performing a selective etching process to the planarized pre-metal dielectric and the multi-layer dielectric further comprises:
etching downward from the $Si_3N_4$ high stress layer and stopping at a top surface of the polysilicon gates.

7. The method according to claim 1, wherein the step of performing a selective etching process to the planarized pre-metal dielectric and the multi-layer dielectric further comprises:
etching a dielectric layer adjacent to a top surface of the polysilicon gates and stopping at the top surface of the polysilicon gates according to the pre-set etching parameters to expose the polysilicon gates.

8. The method according to claim 7, wherein the dielectric layer adjacent to the top surface of the polysilicon gates is a SiO2 dielectric layer; during etching the dielectric layer adjacent to the top surface of the polysilicon gates, an etching selectivity ratio of SiO2 to polysilicon is greater than 25:1; etching gas includes CF4 at a flow rate of 2-6 sccm, C4F8 at a flow rate of 2-5 sccm, CO at a flow rate of 220-300 sccm, and Ar at a flow rate of 400-500 sccm; the dielectric layer adjacent to the top surface of the polysilicon gates is etched at a radio-frequency power of 1500-2500 W and at a gas pressure of 35-55 mTorr.

* * * * *